United States Patent
Sugimura et al.

(10) Patent No.: US 10,858,753 B2
(45) Date of Patent: Dec. 8, 2020

(54) METHOD AND APPARATUS FOR MANUFACTURING SILICON SINGLE CRYSTAL

(71) Applicant: SUMCO CORPORATION, Tokyo (JP)

(72) Inventors: Wataru Sugimura, Tokyo (JP); Ryusuke Yokoyama, Tokyo (JP); Mitsuaki Hayashi, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 111 days.

(21) Appl. No.: 16/303,923

(22) PCT Filed: May 9, 2017

(86) PCT No.: PCT/JP2017/017517
§ 371 (c)(1),
(2) Date: Nov. 21, 2018

(87) PCT Pub. No.: WO2017/203968
PCT Pub. Date: Nov. 30, 2017

(65) Prior Publication Data
US 2020/0165742 A1    May 28, 2020

(30) Foreign Application Priority Data
May 25, 2016    (JP) .................................. 2016-103983

(51) Int. Cl.
C30B 15/00    (2006.01)
C30B 15/20    (2006.01)
(Continued)

(52) U.S. Cl.
CPC ............ *C30B 15/206* (2013.01); *C30B 15/30* (2013.01); *C30B 29/06* (2013.01); *C30B 30/04* (2013.01)

(58) Field of Classification Search
CPC .......... C30B 15/00; C30B 15/14; C30B 15/22; C30B 29/06
See application file for complete search history.

(56) References Cited

U.S. PATENT DOCUMENTS 5,676,751 A * 10/1997 Banan ..................... C30B 15/14
117/13
6,423,285 B1   7/2002 Itoi et al.
(Continued)

FOREIGN PATENT DOCUMENTS

JP    H06-129911 A    5/1994
JP    H08-231294 A    9/1996
(Continued)

OTHER PUBLICATIONS

International Search Report issued in International Bureau of WIPO Patent Application No. PCT/JP2017/017517, dated Jun. 13, 2017.

*Primary Examiner* — Robert M Kunemund
(74) *Attorney, Agent, or Firm* — Greenblum & Bernstein, P.L.C.

(57) ABSTRACT

A silicon single crystal manufacturing method by a Czochralski method pulls up a silicon single crystal from a silicon melt in a quartz crucible while applying a magnetic field to the silicon melt. During a pull-up process of the silicon single crystal, the surface temperature of the silicon melt is continuously measured, and crystal growth conditions are changed based on a result of frequency analysis of the surface temperature.

11 Claims, 5 Drawing Sheets

(51) Int. Cl.
*C30B 15/30* (2006.01)
*C30B 29/06* (2006.01)
*C30B 30/04* (2006.01)

(56) References Cited

U.S. PATENT DOCUMENTS

| | | | |
|---|---|---|---|
| 2002/0029734 A1* | 3/2002 | Mizuta | C30B 29/06 |
| | | | 117/14 |
| 2005/0263062 A1 | 12/2005 | Hoshi et al. | |
| 2006/0137599 A1 | 6/2006 | Cho | |
| 2006/0144320 A1 | 7/2006 | Korb | |
| 2010/0024718 A1* | 2/2010 | Orschel | C30B 15/22 |
| | | | 117/15 |

FOREIGN PATENT DOCUMENTS

| | | |
|---|---|---|
| JP | H09-263486 A | 10/1997 |
| JP | H11-278993 A | 10/1999 |
| JP | 2004-099415 A | 4/2004 |
| JP | 2004-182560 A | 7/2004 |
| JP | 2006-143582 A | 6/2006 |
| JP | 2008-526667 A | 7/2008 |
| JP | 2009-132552 A | 6/2009 |
| JP | 2012-031005 A | 2/2012 |
| JP | 2012-148938 A | 8/2012 |
| TW | 463224 B | 11/2001 |

* cited by examiner

METHOD AND APPARATUS FOR MANUFACTURING SILICON SINGLE CRYSTAL

TECHNICAL FIELD

The present invention relates to a method and apparatus for manufacturing a silicon single crystal by a Czochralski method (hereinafter referred to as "CZ method") and, more particularly, to an MCZ (Magnetic field applied CZ) method that pulls up a single crystal while applying a magnetic field to a silicon melt.

BACKGROUND ART

An MCZ method is known as a variation of a CZ method for manufacturing a silicon single crystal. The MCZ method applies a magnetic field to a silicon melt in a quartz crucible to suppress melt convection to thereby suppress elution of oxygen from the quartz crucible. There are a variety of methods for the magnetic field application, and among them, an HMCZ (Horizontal MCZ) method that pulls up a single crystal while applying a horizontal magnetic field to a silicon melt is being in practical use.

For example, the HMCZ method described in Patent Document 1 sets a magnetic flux center line in the horizontal direction in the vicinity of the melt surface, i.e., within 5 cm from the melt surface throughout the entire process where the silicon single crystal grows. According to this method, convection in the vicinity of the melt surface is suppressed, while heat convection below the vicinity of the melt surface is accelerated, whereby heat transfer to the solid-liquid interface can be enhanced to reduce a difference in temperature between the area around the crucible and the solid-liquid interface. Further, since melt sufficiently stirred below the melt surface is supplied to the solid-liquid interface, a single crystal having more uniform characteristics can be obtained, and crack of the quartz crucible due to heat stress can be prevented. Further, the HMCZ method disclosed in Patent Document 2 performs a single crystal pull-up process with the position of the center of the horizontal magnetic field in the height direction set at a position 100 mm or more distant from the melt surface in order to prevent a sudden increase in the crystal diameter and deterioration in in-plane distribution of oxygen concentration.

In the manufacture of a silicon single crystal by the CZ method, the temperature of the silicon melt needs to be kept constant and, to this end, the surface temperature of the silicon melt is measured. For example, Patent Document 3 describes a silicon single crystal manufacturing method that measures the temperature of the melt surface before dipping a seed crystal by using a radiation thermometer and dips the seed crystal into the melt when the temperature reaches a predetermined value. Further, Patent Document 4 describes a method that accurately measures the temperature of the melt surface by removing influence of disturbance light using a stray light removing plate mounted to a chamber inner surface. Patent Document 5 describes that influence of stray light is removed by measuring the temperature of the melt surface using two radiation thermometers and a temperature measurement auxiliary plate to allow the temperature of the melt surface to be measured with high accuracy, continuously and with a good following property to a temperature change.

CITATION LIST

Patent Document

[Patent Document 1] Japanese Patent Application Laid-Open No. H08-231294
[Patent Document 2] Japanese Patent Application Laid-Open No. 2004-182560
[Patent Document 3] Japanese Patent Application Laid-Open No. 2012-148938
[Patent Document 4] Japanese Patent Application Laid-Open No. H09-263486
[Patent Document 5] Japanese Patent Application Laid-Open No. H06-129911

SUMMARY OF THE INVENTION

Problem to be Solved by the Invention

In the MCZ method, it is desirable not only to reduce oxygen concentration in the silicon single crystal by suppressing the melt convection, but also to make oxygen concentration distribution in the silicon single crystal cross section perpendicular to a silicon single crystal pull-up shaft direction uniform as much as possible. When the oxygen concentration in the silicon single crystal cross section less varies, the incidence of a device failure in a chip cut out from a silicon wafer can be reduced.

However, in a conventional MCZ method, an in-plane variation in oxygen concentration cannot be reduced, causing lowering of product yield.

The object of the present invention is therefore to provide a silicon single crystal manufacturing method and a silicon single crystal manufacturing apparatus capable of reducing the in-plane variation in oxygen concentration.

Means for Solving the Problem

The in-plane variation in oxygen concentration is believed to occur due to the curved shape of the solid-liquid interface or periodic variations in the amount of oxygen taken from the solid-liquid interface. When a silicon single crystal is sliced in the radial direction thereof, the wafer cross section alternately intersects regions of high oxygen concentration and low oxygen concentration, with the result that oxygen concentration varies in the vertical direction in the cross section of the cut wafer. The behavior of oxygen concentration can be confirmed by photographing an X-ray topographic image after precipitation heat treatment, making use of an oxygen precipitation phenomenon in the silicon single crystal, and a concentric oxygen precipitation pattern called oxygen striation is observed.

The generation source of oxygen is the quartz crucible, and the generated oxygen is transported to the solid-liquid interface mainly by melt convection. Thus, it is estimated that the melt convection also periodically varies like the periodic variation in the oxygen concentration. In order to grasp the oscillation phenomenon of the melt convection during crystal growth, the present inventors attached a radiation thermometer capable of continuously measuring the melt surface temperature to a CZ furnace and measured the surface temperature of the silicon melt using the radiation thermometer while growing the silicon single crystal. From the result of frequency analysis of the acquired surface temperature data, mainly two types of periods: a period synchronized with rotation of the crucible; and a period not synchronized therewith were observed. The relative relationship in amplitude between these periods was found to be related to the in-plane variation in oxygen concentration in the single crystal. More specifically, the in-plane variation in oxygen concentration was favorably small under crystal growth conditions where A (amplitude intensity of the rotation period of the crucible) B (maximum amplitude intensity among those of the periods other than the rotation period of the crucible). Further, in a wafer in which the in-plane variation in oxygen concentration is small, device yield of a cut chip was found to be high.

The present invention has been made based on such technical knowledge, and a silicon single crystal manufacturing method according to the present invention is a silicon single crystal manufacturing method by a Czochralski method in which a silicon single crystal is pulled up from a silicon melt in a quartz crucible while applying a magnetic field to the silicon melt, wherein the surface temperature of the silicon melt is continuously measured during a pull-up process of the silicon single crystal, and crystal growth conditions are changed based on a result of frequency analysis of the surface temperature.

Further, a silicon single crystal manufacturing apparatus according to the present invention includes a quartz crucible supporting a silicon melt, a crucible rotary mechanism rotating the quartz crucible, a magnetic field applying device applying a magnetic field to the silicon melt, a pull-up mechanism pulling up a silicon single crystal from the silicon melt, a radiation thermometer for continuously measuring the surface temperature of the silicon melt, an operation unit performing frequency analysis of the surface temperature measured by the radiation thermometer, and a controller controlling the magnetic field applying device based on a result of the frequency analysis of the surface temperature.

According to the present invention, a variation in oxygen concentration in a crystal radial direction perpendicular to a silicon single crystal pull-up shaft direction can be reduced. This allows a wafer having a uniform in-plane distribution of oxygen concentration to be obtained, thereby reducing a defective rate of device characteristics of a small-sized chip cut out from the wafer.

In the present invention, the crystal growth conditions are preferably changed such that, among periods included in a periodic spectrum of the surface temperature, periods other than a rotation period of the quartz crucible is made equal to or less than a threshold. Among oscillation periods of the amplitude of the silicon melt surface temperature, the periods not synchronized with rotation of the crucible are considered to be oscillation caused due to instability of melt convection. Thus, by making a crystal growth conditions, e.g., the height position of a magnet appropriate so as to suppress the maximum amplitude intensity among those of the periods other than the rotation period of the quartz crucible, a high quality silicon single crystal having a uniform in-plane oxygen concentration can be grown.

In the present invention, the threshold is the amplitude intensity of the rotation period of the quartz crucible included in the periodic spectrum of the surface temperature, and it is preferable to change the crystal growth conditions such that the relationship between an amplitude intensity A of the rotation period of the quartz crucible and a maximum amplitude intensity B among those of the periods other than the rotation period of the quartz crucible satisfies A≥B. When the maximum amplitude intensity B among those of the periods other than the rotation period of the quartz crucible falls below the amplitude intensity A of the rotation period of the quartz crucible, a variation in oxygen concentration in a wafer surface can be suppressed, thereby improving device yield of a chip cut out from the wafer.

In the present invention, it is preferable to previously prepare a data table showing the correspondence between the relative relationship between the A and B and the crystal growth conditions and to derive the crystal growth conditions that can satisfy A≥B for the current residual amount of the silicon melt from the data table. Among oscillation periods of the amplitude of the silicon melt surface temperature, the periods not synchronized with rotation of the crucible are considered to be oscillation caused due to instability of melt convection, and the oscillation is changed according to the residual amount of the silicon melt in the quartz crucible or the height position of a magnetic field. Thus, by making the crystal growth conditions, e.g., the height position of the magnetic field appropriate according to a change in the melt amount, a high quality silicon single crystal having a uniform in-plane oxygen concentration can be grown.

In the present invention, the crystal growth conditions preferably include the height position of the magnetic field and also preferably include the intensity of the magnetic field. By thus adjusting the magnetic field applying condition, a variation in oxygen concentration in a wafer surface can be suppressed. Thus, by making the height position or intensity of the magnetic field appropriate, a high quality silicon single crystal having a uniform in-plane oxygen concentration can be grown.

In the present invention, the surface temperature is preferably measured at a position separated by at least D/30 mm (D is a silicon single crystal target diameter) from the outermost periphery of the silicon single crystal being grown in the vicinity of a crystal growth interface. This allows an accurate measurement of the periodic oscillation of the silicon melt surface temperature while suppressing influence of disturbance light. The silicon single crystal target diameter D refers to the target diameter of a body section of the silicon single crystal. For example, the target diameter of a silicon single crystal used for manufacturing a wafer having a diameter of 300 mm can be set to 320 mm, and the target diameter of a silicon single crystal used for manufacturing a wafer having a diameter of 450 mm can be set to 480 mm.

A silicon single crystal manufacturing method according to another aspect of the present invention includes, during a silicon single crystal pull-up process by a Czochralski method that pulls up a silicon single crystal from a silicon melt in a quartz crucible while applying a magnetic field to the silicon melt, continuously measuring the surface temperature of the silicon melt and pulling up a body section of the silicon single crystal under the condition that the relationship between an amplitude intensity A of the rotation period of the quartz crucible included in a periodic spectrum of the surface temperature and the maximum amplitude intensity B among those of the periods other than the rotation period of the quartz crucible included therein satisfies A≥B. When the maximum amplitude intensity B among those of the periods other than the rotation period of the quartz crucible falls below the amplitude intensity A of the rotation period of the quartz crucible, the in-plane variation in oxygen concentration of a wafer cut out from the body section can be suppressed, allowing improvement of device yield of a chip cut out from the wafer. The state satisfying A≥B is desirably obtained in the entire region of the body section; however, it need not necessarily be obtained in the entire region of the body section, but only needs to be obtained at least a part of the body section.

Advantageous Effects of the Invention

According to the present invention, there can be provided a silicon single crystal manufacturing method and a silicon single crystal manufacturing apparatus capable of suppressing the in-plane variation in oxygen concentration.

DETAILED DESCRIPTION OF THE EMBODIMENTS

Preferred embodiments of the present invention will be described in detail below with reference to the accompanying drawings.

Figure 1:
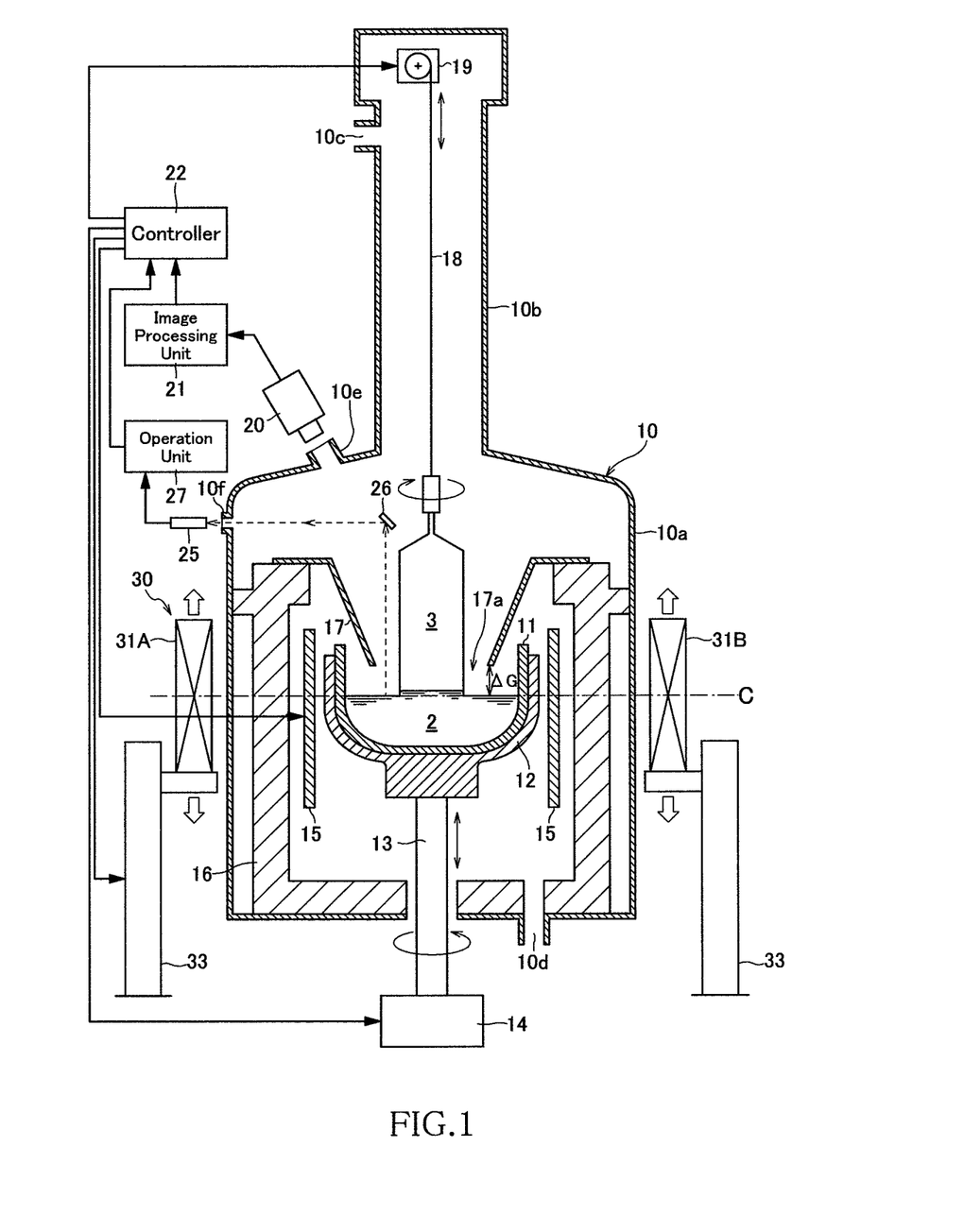
FIG. 1 is a cross-sectional side view schematically illustrating the configuration of a single crystal manufacturing apparatus according to an embodiment of the present invention.

FIG. 1 is a cross-sectional side view schematically illustrating the configuration of a single crystal manufacturing apparatus according to an embodiment of the present invention.

As illustrated in FIG. 1, a single crystal manufacturing apparatus 1 includes a water-cooled type chamber 10, a quartz crucible 11 holding a silicon melt 2 in the chamber 10, a graphite crucible 12 holding the quartz crucible 11, a rotary shaft 13 supporting the graphite crucible 12, a shaft drive mechanism 14 rotating and lifting the rotary shaft 13, a heater 15 disposed around the graphite crucible 12, a heat insulating material 16 disposed outside the heater 15 along the inner surface of the chamber 10, a heat-shield body 17 disposed above the quartz crucible 11, a single crystal pull-up wire 18 disposed above the quartz crucible 11 so as to be coaxial with the rotary shaft 13, and a wire winding mechanism 19 disposed at the upper portion of the chamber 10.

The chamber 10 is constituted of a main chamber 10a and an elongated cylindrical pull chamber 10b connected to the upper opening of the main chamber 10a, and the quartz crucible 11, graphite crucible 12, heater 15, and heat-shield body 17 are provided inside the main chamber 10a. A gas inlet 10c for introducing inert gas (purge gas) such as argon gas, or dopant gas into the chamber 10 is formed in the pull chamber 10b, and a gas outlet 10d for discharging atmospheric gas from the inside of the chamber 10 is formed at the bottom of the main chamber 10a. Further, an observation window 10e is formed at the upper portion of the main chamber 10a and a growing state of a silicon single crystal 3 can be observed through the observation window 10e.

The quartz crucible 11 is a vessel made of quartz glass having a cylindrical side wall and a curved bottom. The graphite crucible 12 tightly contacts the outer surface of the quartz crucible 11 so as to hold the quartz crucible 11, covering the outer periphery thereof, in order to maintain the shape of the quartz crucible 11 softened by heating. The quartz crucible 11 and graphite crucible 12 constitute a double-structured crucible supporting the silicon melt in the chamber 10.

The graphite crucible 12 is fixed to the upper end portion of the rotary shaft 13. The lower end portion of the rotary shaft 13 penetrates the bottom portion of the chamber 10 to be connected to the shaft drive mechanism 14 provided outside the chamber 10. The rotary shaft 13 and shaft drive mechanism 14 constitute a rotary mechanism and a lifting mechanism for both the quartz crucible 11 and the graphite crucible 12.

The heater 15 is used to melt a silicon raw material filled in the quartz crucible 11 to generate the silicon melt 2 and to maintain the molten state of the silicon melt 2. The heater 15 is a resistance heating type heater made of carbon and is provided so as to surround the quartz crucible 11 in the graphite crucible 12. The heater 15 is surrounded by the heat insulating material 16, whereby heat retention performance inside the chamber 10 can be enhanced.

The heat-shield body 17 forms an adequate hot zone around the crystal growth interface by suppressing a temperature variation of the silicon melt 2 and prevents the single crystal 3 from being heated by radiation heat from the heater 15 and the quartz crucible 11. The heat-shield body 17 is a graphite member covering an area above the silicon melt 2 excluding the pull-up path for the silicon single crystal 3 and has, e.g., an inverted truncated cone shape having an aperture size gradually increased from the lower end to the upper end thereof.

An opening 17a at the lower end of the heat-shield body 17 has a diameter larger than that of the silicon single crystal 3, thereby ensuring the pull-up path for the silicon single crystal 3. The diameter of the opening 17a of the heat-shield body 17 is smaller than the opening diameter of the quartz crucible 11, and the lower end portion of the heat-shield body 17 is positioned inside the quartz crucible 11, so that even when the upper end of the rim of the quartz crucible 11 is lifted to a position higher than the lower end of the heat-shield body 17, the heat-shield body 17 does not interfere with the quartz crucible 11.

The amount of melt in the quartz crucible 11 decreases with the growth of the silicon single crystal 3; however, by lifting the quartz crucible 11 so as to keep a gap ΔG between the melt surface and the lower end of the heat-shield body 17 constant, it is possible to suppress a temperature variation of the silicon melt 2 and to make the flow rate of gas flowing in the vicinity of the melt surface constant, thereby controlling the evaporation amount of a dopant from the silicon melt 2. Thus, stability of crystal defect distribution, oxygen concentration distribution, resistivity distribution, etc., in the pull-up shaft direction of the silicon single crystal 3 can be improved.

The wire 18 serving as the pull-up shaft for the silicon single crystal 3 and the wire winding mechanism 19 winding the wire 18 are provided above the quartz crucible 11. The wire winding mechanism 19 has a function of rotating the silicon single crystal 3 with the wire 18. The wire winding mechanism 19 is provided at the upper portion of the pull chamber 10b. The wire 18 extends downward from the wire winding mechanism 19, passing through the pull chamber 10b and the leading end thereof reaches the inner space of the main chamber 10a. FIG. 1 illustrates a state where the silicon single crystal 3 being grown is suspended on the wire 18. Upon pull-up of the silicon single crystal 3, the wire 18 is gradually pulled up while the quartz crucible 11 and silicon single crystal 3 are being rotated to grow the silicon single crystal 3.

The observation windows 10e and 10f for observing the inside of the chamber 10 are provided at the upper portion of the main chamber 10a, and a CCD camera 20 is installed outside the observation window 10e. During the pull-up of the single crystal, the CCD camera 20 photographs from the obliquely upward direction the boundary between the silicon single crystal 3 and the silicon melt 2 that can be seen through the observation window 10e and the opening 17a of the heat-shield body 17. The photographed image obtained by the CCD camera 20 is processed in an image processing unit 21, and the processing results are used for control of pull-up conditions in a controller 22.

A radiation thermometer 25 for measuring the surface temperature of the silicon melt 2 is installed outside the observation window 10f formed in the main chamber 10a, and a silicon mirror 26 is installed inside the main chamber 10a at the same height position as the radiation thermometer 25. The silicon mirror 26 is disposed at an angle of 45° with respect to the melt surface, and light traveling directly upward from the melt surface and reflected by the silicon mirror 26 is taken in the radiation thermometer 25. As described above, the radiation thermometer 25 receives radiation light of the silicon melt 2 emitted directly upward from the melt surface and measures the surface temperature of the silicon melt 2, so that it is possible to accurately measure the surface temperature of the silicon melt 2 while suppressing influence of disturbance light such as multiple reflection light. Temperature data measured by the radiation thermometer 25 is processed by an operation unit 27, and the processing results are used for the control of pull-up conditions in a controller 22.

A magnetic field applying device 30 includes a pair of electromagnet coils 31A and 31B disposed opposite to each other across the main chamber 10a and a lift mechanism 33 liftably supporting the electromagnet coils 31A and 31B. The electromagnet coils 31A and 31B and lift mechanism 33 operate according to instructions from the controller 22. Specifically, magnetic field intensity and the height position of the electromagnet coils 31A and 31B are controlled. The center position (magnetic field center position C) of a horizontal magnetic field generated by the magnetic field applying device 30 can be moved in the vertical direction. The magnetic field center position C refers to the height position of a horizontal line (magnetic field center line) connecting the centers of the opposing electromagnet coils 31A and 31B. According to the horizontal magnetic field method, convection of the silicon melt 2 can effectively be suppressed.

In the pull-up process of the silicon single crystal 3, a seed crystal is lowered to be dipped into the silicon melt 2. Then, the seed crystal is gradually lifted while the seed crystal and quartz crucible 11 are being rotated, whereby the silicon single crystal 3 having a substantially columnar shape is grown at the lower end of the seed crystal. At this time, the diameter of the silicon single crystal 3 is adjusted by controlling the pull-up speed of the silicon single crystal 3 and the power of the heater 15. Further, by applying the horizontal magnetic field to the silicon melt 2, melt convection in a direction perpendicular to magnetic force lines can be suppressed.

Figure 2:
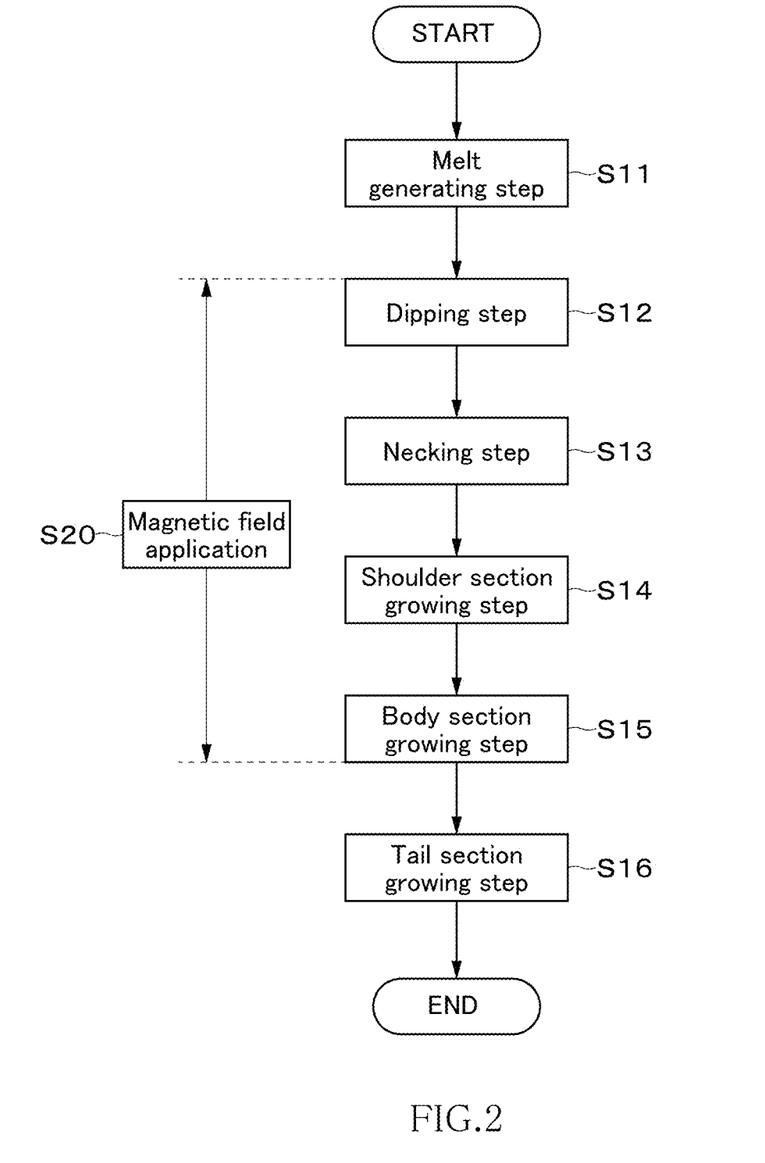
FIG. 2 is a flowchart illustrating a silicon single crystal manufacturing process according to an embodiment of the present invention.
Figure 3:
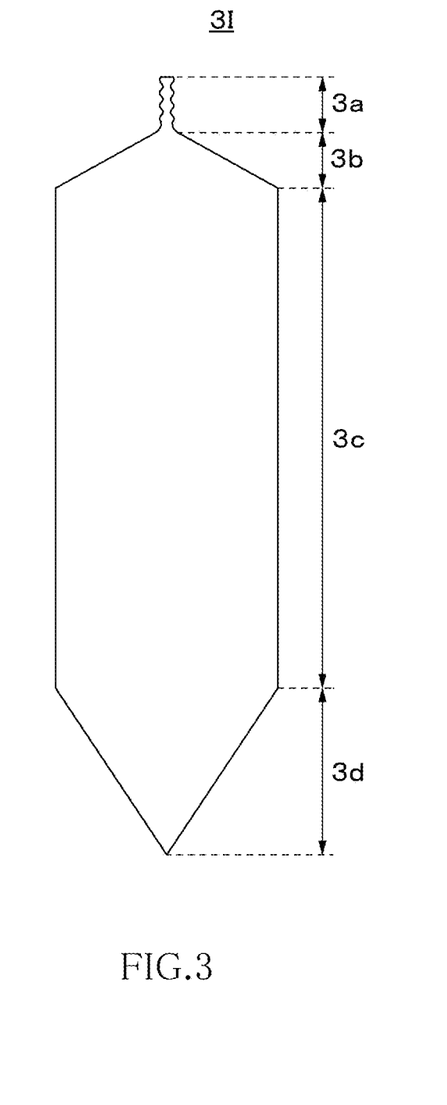
FIG. 3 is a schematic cross-sectional view illustrating the shape of a silicon single crystal ingot.

FIG. 2 is a flowchart illustrating a silicon single crystal manufacturing process according to an embodiment of the present invention. FIG. 3 is a schematic cross-sectional view illustrating the shape of a silicon single crystal ingot.

As illustrated in FIG. 2, in the manufacturing of the silicon single crystal according to the present embodiment, a silicon raw material in the quartz crucible 11 is heated by the heater 15 to be molten to generate the silicon melt 2 (step S11). Then, a seed crystal attached to the leading end portion of the wire 18 is lowered to be dipped into the silicon melt 2 (step S12). After that, a single crystal pull-up process is performed, in which the seed crystal is gradually pulled up while being in contact with the silicon melt 2 to grow the single crystal (steps S13 to S16).

In the single crystal pull-up process, a necking step (step S13) of forming a neck section 3a whose crystal diameter is narrowed so as to avoid dislocation, a shoulder section growing step (step S14) of forming a shoulder section 3b whose crystal diameter is gradually increased, a body section growing step (step S15) of forming a body section 3c whose crystal diameter is kept at a prescribed value (e.g., 320 mm), and a tail section growing step (step S16) of forming a tail section 3d whose crystal diameter is gradually reduced are sequentially performed. Finally, the single crystal is separated from the melt surface. Through the above steps, a silicon single crystal ingot 3I having the neck section 3a, shoulder section 3b, body section 3c and tail section 3d as illustrated in FIG. 3 is completed.

From the start of the dipping step S12 until the end of the body section growing step S15, a magnetic field application process of pulling up the single crystal with the magnetic field center position C set, e.g., in the vicinity of the melt surface is performed (step S20). The "vicinity of the melt surface" refers to a range of ±50 mm from the liquid surface of the silicon melt 2. When the magnetic field center position C falls within this range, an effect equivalent to that when the magnetic field center position C coincides with the melt surface can be obtained, whereby convection at the melt surface can be suppressed.

When the melt is consumed along with the growing of the single crystal, the melt surface gradually lowers. At this time, the quartz crucible 11 is lifted in response to the lowering of the melt surface so as to control the absolute height of the melt surface constant. As a result, the distance (gap) between the melt surface and the lower end of the heat-shield body can be kept constant, and the magnetic field center position C can be fixed in the vicinity of the melt surface.

By thus setting the magnetic field center position C in the vicinity of the melt surface of the silicon melt 2 in the single crystal body section growing step S15, heat convection in the vicinity of the melt surface is suppressed, while heat convection below the vicinity of the melt surface is accelerated, whereby heat transfer to the solid-liquid interface can be enhanced to reduce a difference in temperature between the area around the crucible and the solid-liquid interface. Further, the silicon melt 2 sufficiently stirred below the melt surface is supplied to the solid-liquid interface and, hence, a single crystal having more uniform characteristics can be obtained and crack of the quartz crucible 11 due to heat stress can be prevented.

Figure 4:
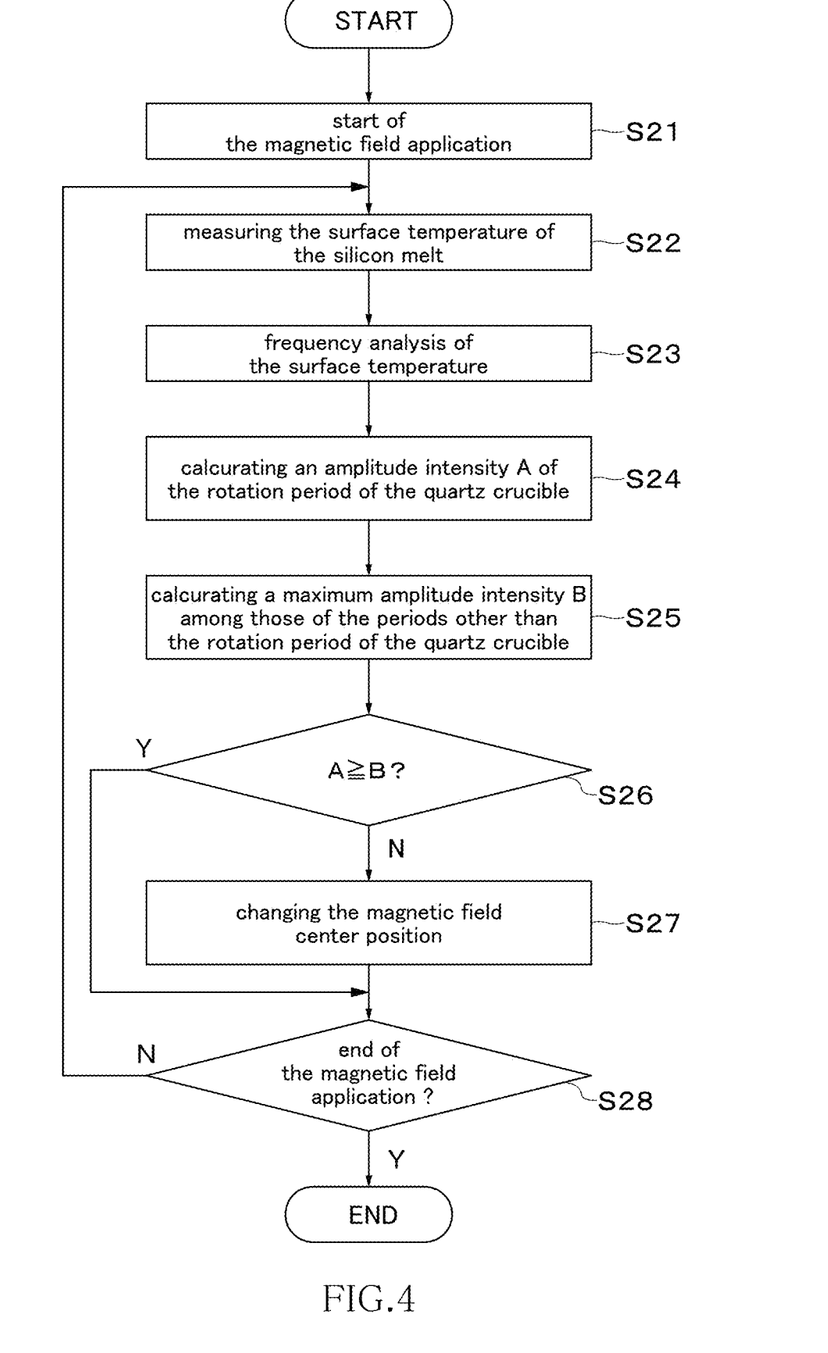
FIG. 4 is a flowchart for explaining a magnetic field applying device control method based on the surface temperature of the silicon melt.

FIG. 4 is a flowchart for explaining a magnetic field applying device control method based on the surface temperature of the silicon melt.

As illustrated in FIG. 4, upon start of the dipping step S12, application of the horizontal magnetic field is started by the magnetic field applying device 30 (step S21). During the pull-up process of the silicon single crystal 3, a temporal change in the surface temperature of the silicon melt 2 is continuously measured by the radiation thermometer 25 (step S22). Temperature data measured by the radiation thermometer 25 is sent to the operation unit 27, where frequency analysis of the surface temperature of the silicon melt 2 is performed (step S23).

In the frequency analysis of the surface temperature of the silicon melt 2, an amplitude intensity A of the rotation period of the quartz crucible 11 and a maximum amplitude intensity B among those of the periods other than the rotation period of the quartz crucible 11 are calculated (steps S24 and S25), and the obtained intensities A and B are compared. When A≥B is satisfied, the magnetic field center position is maintained without change (Y in step S26); on the other hand, when A<B is satisfied, the magnetic field center position is changed so as to satisfy A≥B (N in steps S26 and S27). Such control is continued until the end of the magnetic field application (N in step S28, S21 to S27).

The surface temperature of the silicon melt 2 is influenced by melt convection, and the melt convection is influenced by rotation of the quartz crucible 11. Accordingly, a rotation period component of the quartz crucible 11 is constantly superimposed on a surface temperature amplitude fluctuation. When the quartz crucible 11 is mounted to the rotary shaft 13, it is difficult to make the center axis of the quartz crucible 11 and that of the rotary shaft 13 completely coincide with each other, and the quartz crucible 11 may become eccentric due to slight axis deviation. Further, as the pull-up process progresses, the quartz crucible 11 is softened and deformed, with the result that the circular shape thereof cannot be maintained. Due to the eccentricity of the quartz crucible 11, the rotation period component of the quartz crucible 11 is transmitted to the surface temperature through the melt convection.

The surface temperature amplitude fluctuation includes period components other than the rotation period of the quartz crucible 11, and when the amplitude fluctuation of the period components other than the rotation period of the quartz crucible 11 is very large, a change in the melt convection becomes large, increasing the in-plane variation in oxygen concentration in the silicon single crystal 3. To cope with this, control is performed to suppress the amplitude fluctuation of the periods other than the rotation period of the quartz crucible 11 by changing the magnetic field center position.

In the frequency analysis of the surface temperature of the silicon melt 2, only the maximum amplitude intensity B among those of the periods other than the rotation period of the quartz crucible 11 may be calculated. In this case, whether or not to change the magnetic field center position is determined according to whether the maximum amplitude intensity B exceeds a predetermined threshold. That is, the magnetic field center position may be changed so as to make the maximum amplitude intensity B among those of the periods other than the rotation period of the quartz crucible 11 equal to or smaller than the threshold.

When the magnetic field center position is to be changed based on the result of the frequency analysis of the surface temperature of the silicon melt 2, the current residual amount of the silicon melt 2 is taken into consideration. This is because action of the magnetic field with respect to the silicon melt 2 differs between when the residual amount of the silicon melt 2 is large and when it is small even when the frequency analysis results are the same.

Thus, in the present embodiment, a data table showing the correspondence between the relative relationship between the amplitude intensities A and B and the magnetic field center position for each residual amount of the silicon melt is previously prepared, and the magnetic field center position C that can satisfy A≥B for the current residual amount of the silicon melt 2 is derived from the data table and applied. This allows an adequate magnetic field center position according to the residual melt amount to be set.

The surface temperature of the silicon melt 2 is measured at a position separated from the outermost periphery of the silicon single crystal 3 being grown in the vicinity of the crystal growth interface by at least D/30 mm (D is a target diameter of the silicon single crystal). This is because when the measurement position is too close to the silicon single crystal 3, behavior of a variation in the crystal diameter is superimposed on the periodic oscillation of the surface temperature due to meniscus, degrading temperature data. The meniscus is the curved surface of the silicon melt 2 formed at the boundary with the silicon single crystal 3, and influence thereof extends over a wider range as the diameter of the silicon single crystal 3 becomes larger. Thus, the measurement position is preferably separated from the outermost periphery by 10.7 mm or more when the diameter of the silicon single crystal is 320 mm and separated from the outermost periphery by 16 mm or more when the diameter of the silicon single crystal is 480 mm.

Figure 5A:
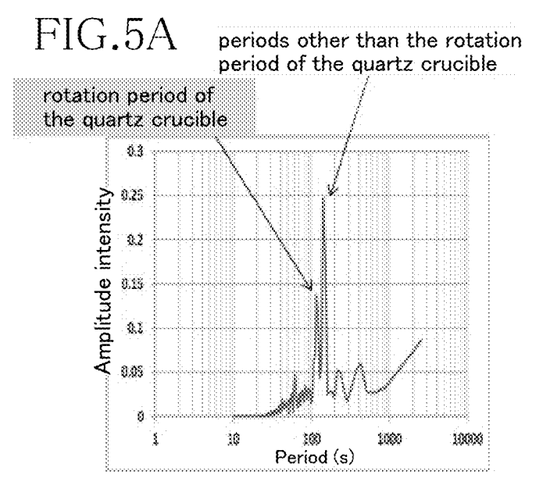
FIGS. 5A and 5B are graphs each illustrating an example of the result of the frequency analysis of the surface temperature of the silicon melt 2 measured by the radiation thermometer 25.
Figure 5B:
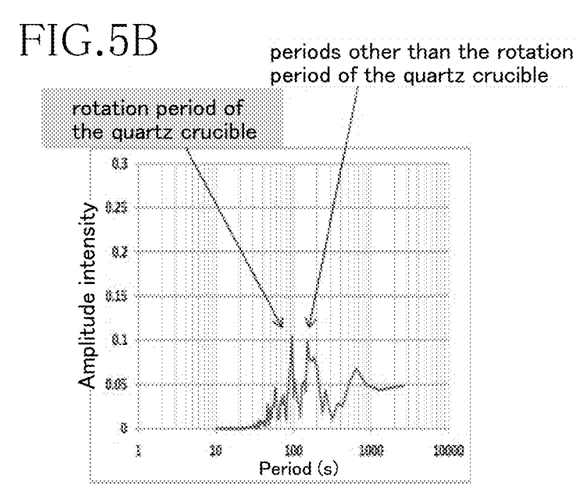

FIGS. 5A and 5B are graphs each illustrating an example of the result of the frequency analysis of the surface temperature of the silicon melt 2 measured by the radiation thermometer 25, in which the horizontal axis indicates the oscillation period (s) of the amplitude of the surface temperature, and the vertical axis indicates the amplitude intensity of the surface temperature.

The periodic spectrum of the surface temperature of the silicon melt 2 illustrated in FIG. 5A has two peaks, one of which is the peak of the rotation period of the quartz crucible 11 in the surface temperature of the silicon melt 2 and the other one of which is the peak of a period other than the rotation period of the quartz crucible 11. In this example, the peak level (amplitude intensity B) of the period other than the rotation period of the quartz crucible 11 exceeds the peak level (amplitude intensity A) of the rotation period of the quartz crucible 11. Such a peak pattern indicates a tendency that a variation in the oxygen concentration in the cross section of the silicon single crystal 3 becomes large, so that the height position of the magnetic field center position C is changed.

While the periodic spectrum of the surface temperature of the silicon melt 2 illustrated in FIG. 5B has one peak in the rotation period of the quartz crucible 11 and another peak in a period other than the rotation period of the quartz crucible 11 as in the case of FIG. 5A, the peak level (amplitude intensity A) of the rotation period of the quartz crucible 11 exceeds the peak level (amplitude intensity B) of the period other than the rotation period of the quartz crucible 11. Such a peak pattern indicates a tendency that a variation in the oxygen concentration in the cross section of the silicon single crystal 3 is suppressed, so that the pull-up of the silicon single crystal 3 is continued without changing the height position of the magnetic field center position C.

Thus, in the silicon single crystal manufacturing method according to the present embodiment, the pull-up process of the body section of the silicon single crystal is performed under the condition that the relationship between the amplitude intensity A of the rotation period of the quartz crucible included in the periodic spectrum of the surface temperature and the maximum amplitude intensity B among those of the periods other than the rotation period of the quartz crucible included therein satisfies A≥B. Thus, the in-plane variation in oxygen concentration in a wafer cut out from the body section of the silicon single crystal grown under the condition of A≥B can be reduced, allowing improvement of device yield of a chip cut out from the wafer. While the state satisfying A≥B is desirably obtained in the entire region of the body section, it need not necessarily be obtained in the entire region of the body section, but only needs to be obtained at least in part of the body section.

As described above, according to the silicon single crystal manufacturing method of the present embodiment, the height position of the magnetic field center position C is changed based on the result of the frequency analysis of the surface temperature of the silicon melt 2, so that a variation in oxygen concentration in the cross section of the silicon single crystal 3 can be suppressed. This allows improvement of product yield of a semiconductor device manufactured from a wafer cut out from the silicon single crystal 3.

While the preferred embodiments of the present invention have been described, the present invention is not limited to the above embodiments, and various modifications may be made within the scope of the present invention. Accordingly, all such modifications are included in the present invention.

While, in the above embodiment, the magnetic field center position is controlled based on the result of the frequency analysis of the surface temperature of the silicon melt, for example, the intensity of the magnetic field may be controlled in place of the magnetic field center position. Like the magnetic field center position, the magnetic field intensity can also be adjusted based on the result of the frequency analysis of the surface temperature of the silicon melt 2. Further, the control target may be crystal growth conditions other than the magnetic field application condition, such as the rotation speed (rotation period) of the quartz crucible, output of the heater 15, pull-up speed of the silicon single crystal 3, or lifting speed of the quartz crucible 11. Further, the control target may be an appropriate combination of the above conditions. Further, the present invention may be applied to the manufacture of a single crystal other than the silicon single crystal.

Examples

First, the measurement position at which the surface temperature of the silicon melt is measured by the radiation thermometer was evaluated.

In the evaluation test, the silicon single crystal manufacturing apparatus illustrated in FIG. 1 was used to produce a silicon single crystal having a diameter of 320 mm by the MCZ method. At the same time, the surface temperature was measured at positions separated by 3.2 mm, 5.3 mm, 7.1 mm, 10.7 mm, and 32 mm from the outermost periphery of the silicon single crystal being grown in the vicinity of the crystal growth interface, and the frequency analysis of each of the measured surface temperatures was performed. Results are shown in Table 1. A target diameter D of the silicon single crystal to be grown is 320 mm, so that, for example, 3.2 mm is written as D/100 mm in Table 1.

TABLE 1

| Measurement position (mm) | Detection of peak by frequency analysis | |
|---|---|---|
| D/100 | Undetectable (large Disturbance) | x |
| D/60 | Undetectable (large disturbance) | x |

TABLE 1-continued

| Measurement position (mm) | Detection of peak by frequency analysis | |
|---|---|---|
| D/45 | Difficult to detect | Δ |
| D/30 | Difficult to detect | ○ |
| D/10 | Detectable, clear | ○ (double circle) |

As is clear from Table 1, at the measurement positions separated by 3.2 mm and 5.3 mm from the outermost periphery of the silicon single crystal, disturbance is so large that the peak of the frequency spectrum cannot be detected. Similarly, at the measurement position separated by 7.1 mm from the outermost periphery of the silicon single crystal, disturbance is large to make it difficult to detect the peak of the frequency spectrum. On the other hand, at the measurement position separated by 10.7 mm from the outermost periphery of the silicon single crystal, disturbance is small, allowing the peak of the frequency spectrum to be detected, and at the measurement position separated by 32 mm, the peak of the frequency spectrum clearly appears.

The above results reveal that the frequency analysis of the surface temperature of the silicon melt is possible at the measurement position separated by 10.7 mm (D/30 mm) from the outermost periphery of the silicon single crystal or more.

Next, the relative relationship between the amplitude intensities A and B and oxygen concentration distribution in the radial direction in the cross section of the body section of the silicon single crystal were evaluated depending on a difference in the magnetic field center position and residual amount of the silicon melt.

In this evaluation test, the silicon single crystal manufacturing apparatus illustrated in FIG. 1 was used to produce a silicon single crystal having a diameter of 320 mm by the MCZ method. At this time, the height position (magnet position) of the center of the horizontal magnetic field applied by the magnetic field applying device was changed in steps of 50 mm. During the pull-up process of the silicon single crystal, the radiation thermometer was used to continuously measure the surface temperature of the silicon melt. The surface temperature was measured at a position separated by 32 mm from the outermost periphery of the silicon single crystal in the vicinity of the crystal growth interface. Then, the frequency analysis of an obtained temporal change in the surface temperature was performed to calculate the amplitude intensity A of the rotation period of the quartz crucible and maximum amplitude intensity B among those of the periods other than the rotation period of the quartz crucible.

Then, ROG (Radial Oxygen Gradient) in the cross section of the body section of the grown silicon single crystal ingot was calculated. The oxygen concentration was measured by using FTIR (Fourier Transform Infrared Spectroscopy), and the maximum and minimum values thereof were extracted from a total of 30 measurement points set at 5 mm pitch in the radial direction from the center of a wafer cut out from the silicon single crystal ingot and substituted into the following ROG formula to calculate the ROG.

ROG (%)={(maximum value of oxygen concentration−minimum value of oxygen concentration)/ minimum value of oxygen concentration}×100

In Comparative Example 1, a silicon single crystal ingot sample #1 was pulled up with the magnetic field center position fixed at a position higher by 50 mm than a reference position α, and the relative relationship between the amplitude intensities A and B and ROG were calculated for each residual amount of the silicon melt.

In Comparative Example 2, a silicon single crystal ingot sample #2 was pulled up with the magnetic field center position fixed at the reference position α, and the relative relationship between the amplitude intensities A and B and ROG were calculated for each residual amount of the silicon melt.

In Comparative Example 3, a silicon single crystal ingot sample #3 was pulled up with the magnetic field center position fixed at a position lower by 50 mm than the reference position α, and the relative relationship between the amplitude intensities A and B and ROG were calculated for each residual amount of the silicon melt.

Table 2 shows the relation ship among the residual amount of the silicon melt, relative relationship between the amplitude intensities A and B, and ROG in Comparative Examples 1 to 3.

TABLE 2

| Silicon single crystal sample | Magnet position (mm) | Residual melt amount (kg) | Relative relation between amplitude intensities Period of crucible: A Period other than crucible period: B | ROG(%) |
|---|---|---|---|---|
| Comparative Example 1 (sample #1) | α + 50 | 400 | A > B | ROG < 5 |
|  |  | 300 | A = B | 5 ≤ ROG < 10 |
|  |  | 200 | A < B | 10 ≤ ROG |
|  |  | 100 | A > B | ROG < 5 |
| Comparative Example 2 (sample #2) | α | 400 | A = B | 5 ≤ ROG < 10 |
|  |  | 300 | A > B | ROG < 5 |
|  |  | 200 | A < B | 10 ≤ ROG |
|  |  | 100 | A < B | 10 ≤ ROG |
| Comparative Example 3 (sample #3) | α − 50 | 400 | A < B | 10 ≤ ROG |
|  |  | 300 | A < B | 10 ≤ ROG |
|  |  | 200 | A > B | ROG < 5 |
|  |  | 100 | A > B | ROG < 5 |

As shown in Table 2, in Comparative Example 1 in which the magnetic field center position is set at a position comparatively as high as α+50 (mm), the relative relationship between the amplitude intensities A and B when the residual melt amount is 400 kg and 100 kg is sufficient (A>B); however, the relative relationship between the amplitude intensities A and B when the residual melt amount is 300 kg is A=B, and the relative relationship between the amplitude intensities A and B when the residual melt amount is 200 kg is A<B. The ROG when the relative relationship between the amplitude intensities A and B is A>B is lower than 5%, the ROG when A=B is equal to or higher than 5% and less than 10%, while the ROG when A<B is equal to or higher than 10%.

In Comparative Example 2 in which the magnetic field center position is set at the position of α (mm), the relative relationship between the amplitude intensities A and B when the residual melt amount is 300 kg is sufficient (A>B); however, the relative relationship between the amplitude intensities A and B when the residual melt amount is 400 kg is A=B, and the relative relationship between the amplitude intensities A and B when the residual melt amount is 200 kg and 100 kg is A<B. The ROG when the relative relationship between the amplitude intensities A and B is A>B is lower than 5%, the ROG when A=B is equal to or higher than 5% and less than 10%, while the ROG when A<B is equal to or higher than 10%.

In Comparative Example 3 in which the magnetic field center position is set at a position comparatively as low as α−50 (mm), the relative relationship between the amplitude intensities A and B when the residual melt amount is 200 kg and 100 kg is sufficient (A>B); however, the relative relationship between the amplitude intensities A and B when the residual melt amount is 400 kg and 300 kg is A<B. The ROG when the relative relationship between the amplitude intensities A and B is A>B is lower than 5%, while the ROG when A<B is equal to or higher than 10%.

Then, a silicon single crystal ingot of example 1 was pulled up, and the relative relationship between the amplitude intensities A and B and ROG were calculated for each residual amount of the silicon melt. In example 1, the results of Comparative Examples 1 to 3 of Table 2 were used as "data table", and the silicon single crystal was grown under the condition that A>B was satisfied for each residual melt amount. That is, a silicon single crystal ingot sample #4 was pulled up as follows: the pull-up was started with the magnetic field center position initially set to the position of α+50 (mm); the magnetic field center position was changed from the position of α+50 (mm) to α (mm) at a time point when A<B was detected in a state where the residual amount of the silicon melt fell within a range of 400 kg to 300 kg; and the magnetic field center position was changed from the position of α (mm) to α−50 (mm) at a time point when A<B was detected in a state where the residual amount of the silicon melt fell within a range of 300 kg to 200 kg. The results are shown in Table 3.

TABLE 3

| Silicon single crystal sample | Magnet position (mm) | Residual melt amount (kg) | Relative relation between amplitude intensities Period of crucible: A Period other than crucible period: B | ROG ( %) |
|---|---|---|---|---|
| Example 1 (sample #4) | α + 5 0 | 400 | A > B | ROG < 5 |
|  | α | 300 | A > B | ROG < 5 |
|  | α − 50 | 200 | A > B | ROG < 5 |
|  |  | 100 | A > B | ROG < 5 |

As shown in Table 3, in Example 1 in which the magnetic field center position is changed according a change in the relative relationship between the amplitude intensities A and B, the relative relationship between the amplitude intensities A and B always satisfies A>B irrespective of the residual melt amount. Thus, ROG is always lower than 5%, with the result that a variation in the in-plane distribution of oxygen concentration becomes very small.

REFERENCE SIGNS LIST 1 single crystal manufacturing apparatus
2 silicon melt
3I silicon single crystal
3 silicon single crystal ingot
3a neck section
3b shoulder section
3c body section
3d tail section
10 chamber
10a main chamber
10b pull chamber
10c gas inlet
10d gas outlet
10e, 10f observation window 11 quartz crucible
12 graphite crucible
13 rotary shaft
14 shaft drive mechanism
15 heater
16 heat insulating material
17 heat-shield body
17a opening of the heat-shield body
18 wire
19 wire winding mechanism
20 CCD camera
21 image processing unit
22 controller
25 radiation thermometer
26 silicon mirror
27 operation unit
30 magnetic field applying device
31A, 31B electromagnet coil
33 lift mechanism
C magnetic field center position

What is claimed is:

1. A silicon single crystal manufacturing method by a Czochralski method in which a silicon single crystal is pulled up from a silicon melt in a quartz crucible while applying a magnetic field to the silicon melt, comprising:
continuously measuring the surface temperature of the silicon melt during a pull-up process of the silicon single crystal; and
changing crystal growth conditions such that the relationship between an amplitude intensity A of the rotation period of the quartz crucible and a maximum amplitude intensity B among those of the periods other than the rotation period of the quartz crucible satisfies A≥B.

2. The silicon single crystal manufacturing method as claimed in claim 1, wherein
a data table showing the correspondence between the relative relationship between the A and B and the crystal growth conditions is previously prepared, and
the crystal growth conditions that can satisfy A≥B for the current residual amount of the silicon melt are derived from the data table.

3. The silicon single crystal manufacturing method as claimed in claim 1, wherein the crystal growth conditions include the height position of the magnetic field.

4. The silicon single crystal manufacturing method as claimed in claim 1, wherein the crystal growth conditions include the intensity of the magnetic field.

5. The silicon single crystal manufacturing method as claimed in claim 1, wherein the surface temperature is measured at a position separated by at least D/30 mm (D is a silicon single crystal target diameter) from the outermost periphery of the silicon single crystal being grown in the vicinity of a crystal growth interface.

6. A silicon single crystal manufacturing method by a Czochralski method in which a silicon single crystal is pulled up from a silicon melt in a quartz crucible while applying a magnetic field to the silicon melt, comprising:
continuously measuring the surface temperature of the silicon melt during a pull-up process of the silicon single crystal; and
pulling up a body section of the silicon single crystal under the condition that the relationship between an amplitude intensity A of the rotation period of the quartz crucible included in a periodic spectrum of the surface temperature and the maximum amplitude intensity B among those of the periods other than the rotation period of the quartz crucible included therein satisfies A≥B.

7. A silicon single crystal manufacturing apparatus comprising:
a quartz crucible supporting a silicon melt;
a crucible rotary mechanism rotating the quartz crucible;
a magnetic field applying device applying a magnetic field to the silicon melt;
a pull-up mechanism pulling up a silicon single crystal from the silicon melt;
a radiation thermometer continuously measuring the surface temperature of the silicon melt;
an operation unit performing frequency analysis of the surface temperature measured by the radiation thermometer; and
a controller controlling crystal growth conditions such that the relationship between an amplitude intensity A of the rotation period of the quartz crucible and a maximum amplitude intensity B among those of the periods other than the rotation period of the quartz crucible satisfies A≥B.

8. The silicon single crystal manufacturing apparatus as claimed in claim 7, wherein
a data table showing the correspondence between the relative relationship between the A and B and the crystal growth conditions are previously prepared, and
the crystal growth conditions that can satisfy A≥B for the current residual amount of the silicon melt are derived from the data table.

9. The silicon single crystal manufacturing apparatus as claimed in claim 7, wherein the crystal growth conditions include the height position of the magnetic field.

10. The silicon single crystal manufacturing apparatus as claimed in claim 7, wherein the crystal growth conditions include the intensity of the magnetic field.

11. The silicon single crystal manufacturing apparatus as claimed in claim 7, wherein the surface temperature is measured at a position separated by at least D/30 mm (D is a silicon single crystal target diameter) from the outermost periphery of the silicon single crystal being grown in the vicinity of a crystal growth interface.

* * * * *